(12) United States Patent
Hedemäki et al.

(10) Patent No.: US 8,238,131 B2
(45) Date of Patent: Aug. 7, 2012

(54) METHOD OF CHANGING AN OPERATION MODE OF A FREQUENCY CONVERTER BASED ON TEMPERATURE CONDITIONS, AND A FREQUENCY CONVERTER HAVING A CHANGEABLE MODE OF OPERATION BASED ON TEMPERATURE CONDITIONS

(75) Inventors: Ari Hedemäki, Milwaukee, WI (US); Vesa Tiihonen, Vantaa (FI)

(73) Assignee: ABB Oy, Helsinki (FI)

( * ) Notice: Subject to any disclaimer, the term of this patent is extended or adjusted under 35 U.S.C. 154(b) by 953 days.

(21) Appl. No.: 11/637,798

(22) Filed: Dec. 13, 2006

(65) Prior Publication Data

US 2011/0141787 A1 Jun. 16, 2011

(30) Foreign Application Priority Data

Dec. 20, 2005 (FI) ...................................... 20055684

(51) Int. Cl.
 H05K 7/20 (2006.01)
 H02M 5/00 (2006.01)
(52) U.S. Cl. ............................ 363/141; 363/50; 363/159
(58) Field of Classification Search .................... 363/37, 363/50, 55, 95, 141, 159, 178
See application file for complete search history.

(56) References Cited

U.S. PATENT DOCUMENTS

| | | | | |
|---|---|---|---|---|
| 5,589,114 | A * | 12/1996 | Evans | 264/40.6 |
| 5,712,802 | A * | 1/1998 | Kumar et al. | 702/132 |
| 6,294,888 | B1 | 9/2001 | Becker | |
| 6,747,884 | B2 * | 6/2004 | Nishizawa et al. | 363/132 |
| 2003/0076233 | A1 | 4/2003 | Sato et al. | |
| 2005/0071090 | A1 | 3/2005 | Katou | |
| 2006/0013025 | A1 * | 1/2006 | Poyhonen et al. | 363/55 |
| 2007/0097770 | A1 | 5/2007 | Ronkainen et al. | |
| 2008/0170421 | A1 * | 7/2008 | Kishimoto et al. | 363/55 |
| 2008/0272924 | A1 | 11/2008 | Schierling | |

FOREIGN PATENT DOCUMENTS

| | | |
|---|---|---|
| DE | 197 03 617 | 8/1998 |
| GB | 2 281 825 | 3/1995 |
| JP | 8-126337 A | 5/1996 |
| JP | 10-80055 A | 3/1998 |
| JP | 2002-95155 A | 3/2002 |
| JP | 2005-143232 A | 6/2005 |
| WO | WO 2005/043618 | 5/2005 |
| WO | WO 2005/101431 | 10/2005 |

OTHER PUBLICATIONS

European Search Report issued in Patent Application No. 06124370.5-01242/1816733 dated Jan. 14, 2009.
European Office Action issued in corresponding Application No. 06 124 370.5-1242 dated Mar. 18, 2010.

* cited by examiner

*Primary Examiner* — Adolf Berhane
*Assistant Examiner* — Fred E Finch, III
(74) *Attorney, Agent, or Firm* — Buchanan Ingersoll & Rooney PC

(57) ABSTRACT

A method in connection with a frequency converter and a frequency converter, the frequency converter being arranged for periodic recurrent use. The method comprises steps for generating and storing in a memory an average heating of a power semiconductor of the frequency converter, caused by one loading period, determining a temperature limit from the generated heating and the highest allowed temperature of the power semiconductor, determining the temperature of the power semiconductor in the frequency converter, and changing the operation mode of the frequency converter when the temperature of the power semiconductor exceeds the temperature limit when transferring to a loading period.

10 Claims, 2 Drawing Sheets

Legend:
50 – Frequency converter
51 – Cooling system
$52_1$ - $52_3$ – Power semiconductors
53 – Means for determining and storing magnitude of average temperature rise
54 – Memory
55 – Means for determining a temperature limit
56 – Means for determining temperature of power semiconductor
57 – Means for changing operation mode of frequency converter

METHOD OF CHANGING AN OPERATION MODE OF A FREQUENCY CONVERTER BASED ON TEMPERATURE CONDITIONS, AND A FREQUENCY CONVERTER HAVING A CHANGEABLE MODE OF OPERATION BASED ON TEMPERATURE CONDITIONS

BACKGROUND OF THE INVENTION

The present invention relates to a method according to the preambles of the independent claims in connection with a frequency converter, and a frequency converter.

In certain applications of a frequency converter the thermal stress directed towards the frequency converter varies periodically. Such applications include centrifuges, cranes, metal rollers and elevators. A cyclic load is typically formed of acceleration, smooth driving, braking and of an unloaded state, whereby the power components of the frequency converter are considerably stressed during acceleration and braking.

Dimensioning the frequency converters is carried out conventionally in accordance with the highest temporary temperature or cyclic temperature variation. The temperature of a power semiconductor is not allowed to exceed a certain limit, since there is a danger of definitely damaging the power semiconductor. Dimensioning for periodic loading is carried out using a set of curves provided by the component manufacturer and estimates concerning the duration of an individual load in a periodic load as well as the temporal density of loads. Such a dimensioning allows achieving the reliability of the operation of the apparatus without over-dimensioning the apparatus when the density of loads and the profile of a load remain substantially within planned limits.

A problem with current frequency converters is that when the temperature of the power semiconductor in the frequency converter exceeds the allowed maximum limit while in use, the frequency converter interrupts the operation thereof while still in operation in order to prevent damaging the frequency converter. Then the process controlled by the frequency converter undesirably stops owing to too frequent recurrent periodic use or the increase in temperature caused by the damaged cooling in the frequency converter.

BRIEF DESCRIPTION OF THE INVENTION

It is an object of the invention to provide a method in connection with a frequency converter and a frequency converter so as to solve the above problem. The object of the invention will be achieved with a method and an apparatus, characterized in what is disclosed in the independent claims.

The preferred embodiments of the invention are disclosed in the dependent claims.

The invention is based on the idea to observe the temperature of the power semiconductor in the frequency converter during periodic use. What may be determined on the basis of the dimensioned or calculated temperature variation before a new loading period is whether loading is allowed to be started without the danger of the temperature of the power semiconductor increasing excessively during the following loading period.

An advantage of the method and apparatus according to the invention is that the periodic loading controlled by the frequency converter cannot in conventional use be stopped by overheat tripping, since the frequency converter is not permitted to fall into such a situation. Close to over-loading the method and the apparatus allow changing the operation of the apparatus to ensure the faultless operation of the frequency converter. Thus for instance a new loading period is not initiated at all or the profile of the load is facilitated, if it is anticipated that the process will be interrupted at a critical stage.

BRIEF DESCRIPTION OF THE DRAWINGS

In the following the invention will be described in greater detail by means of the preferred embodiments with reference to the accompanying drawings, in which.

DETAILED DESCRIPTION OF THE INVENTION

Figure 1:
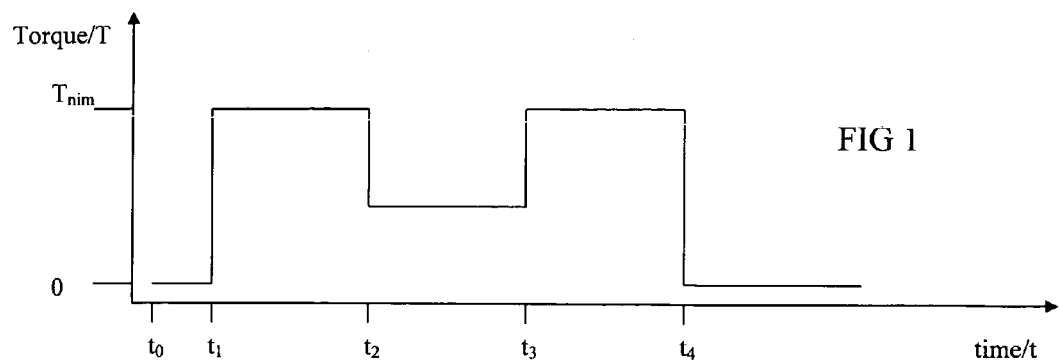
FIGS. 1 and 3 show schematic curve forms of torque in connection with periodic loading.

In a method according to the invention a frequency converter carries out a specific operation periodically in periodic recurrent use. FIG. 1 shows a schematic torque curve of such a loading period. In the initial state $t_0$ the process is stopped or provided with insignificant load and the torque provided by the frequency converter is close to zero. From moment $t_1$ forward the process is accelerated with a considerable torque Tnim until the moment of time $t_2$. Between $t_2$ to $t_3$ the speed of the process remains constant and the torque is typically smaller than the acceleration and braking torque. At moment $t_3$ the process starts to slow down, whereby the torque again reaches the maximum value thereof, and maintains such a value until the moment of time $t_4$, when the torque is reduced again close to zero.

The current of the frequency converter is proportional to the torque produced by the frequency converter. The current in turn causes the power semiconductors to heat, and in FIG. 2 such a heat is indicated in connection with the load changes corresponding to FIG. 1. When the motor is at the moment of time $t_1$ controlled with full torque, the temperature of the power semiconductor starts to rise. The temperature increases during the entire torque step, but starts to decrease at moment $t_2$, when the process has achieved the constant speed thereof. The temperature decreases until moment $t_3$, and thereafter during the braking torque the temperature increases again until moment $t_4$. When the torque decreases close to zero at moment $t_4$ the temperature starts to drop rapidly.

Figure 2:
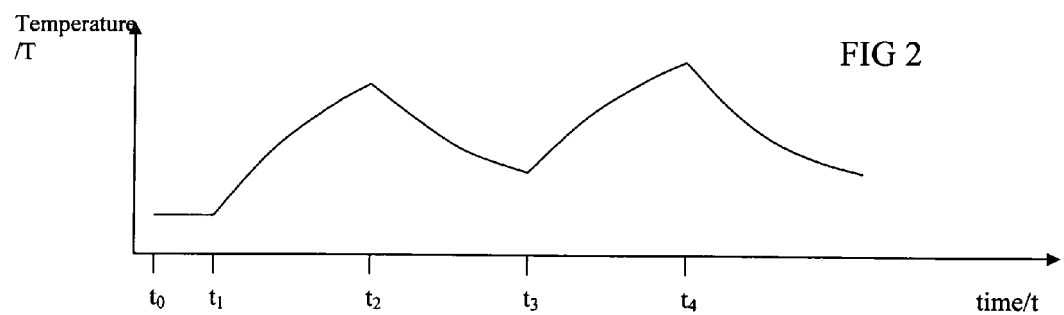
FIGS. 2 and 4 show schematic curve forms of the temperature of a power semiconductor in connection with periodic loading.

The curve form in FIG. 2 is a substantially simplified description of the actual temperature variation, which is affected by temperature time constants of several thermal masses connected to one another. The curve form in FIG. 2 therefore shows that the temperature could change only if dictated by one temperature time constant. However, this does not affect the understanding of the operation of the method according to the invention.

The temperature is preferably determined by measuring the temperature of a cooling element, and what is further generated from the temperature in a way known per se is the temperature of a semiconductor component chip using the thermal model of the semiconductor component.

The temperature varies periodically in connection with the load as described above. The method according to the invention determines a typical power semiconductor heating, i.e. the difference between the maximum and minimum values in the example shown in FIG. 2. In order to reliably obtain the typical value of the heating, the differences between the minimum and maximum temperatures are determined during several loading periods. A describing value is further formed from the collected values for the minimum and maximum, and the difference between them is calculated that shows a typical heating. The minimum and maximum values may be calculated directly as an arithmetic mean. If there is no desire to use several measuring for determining the value of the heating, the values describing the actual situation can be obtained by employing a root-mean-square value, which reduces the relation of individual differing values in the mean. Thus, the heating is most preferably calculated as the difference between several measured mean values of the maximum values and several measured minimum values. Measuring is further carried out in such a manner that the magnitudes of the minimum value are temperatures at the moment, when the cyclic loading starts, i.e. at moment $t_1$ in the examples shown in FIGS. 1 and 2. For instance 10 to 30 of the first loading cycles may be used for determining the mean heating $\Delta T$, and thereafter the mean is calculated and stored in the memory of the frequency converter.

Another possibility for forming and storing the mean heating is to feed it directly into the memory of the frequency converter as a parameter provided by the user. The parameter may then be calculated or estimated based on experience. By feeding the heating as a parameter value into the frequency converter, the apparatus may start anticipatory protection without the identification presented above.

In accordance with the method of the invention a temperature limit is determined from the generated heating and the highest allowed temperature of the power semiconductor. The component manufacturers indicate the highest allowed temperature $T_{max}$ for the semiconductors, which is not to be exceeded in order for the apparatus to remain in working order. The temperature limit $T_{lim}$, according to the invention refers to a temperature, the exceeding of which, when the loading step starts, would increase the temperature of the semiconductor component excessively during the loading step. The temperature limit is therefore calculated as a difference between the highest allowed temperature and the mean heating ($T_{lim}=T_{max}-\Delta T$). Preferably minor inaccuracies can be taken into account when calculating the temperature limit by adding a temperature margin to the mean heating. Such a margin allows observing a possible inaccuracy of the temperature limit.

Also in accordance with the invention the temperature of the power semiconductor is determined. The temperature of the semiconductor chip, or the chip, of the power semiconductor is the most critical temperature in the semiconductor. The temperature of the chip may be determined by measuring the temperature of a part being in thermal connection with a semiconductor component, and by calculating the temperature of the chip using the heating model. The temperature to be measured may for instance be the temperature of a cooling element. It is also possible to measure the temperature of the chip directly, if a possibility to do so is created.

In accordance with the method of the invention the operation mode of the frequency converter is also changed when the temperature of the power semiconductor exceeds the temperature limit, when transferring to the loading period. The operation mode may be changed by delaying the start of the loading period or by lightening the loading period (for instance by reducing the torque limit or maximum speed of the apparatus).

Figure 3:
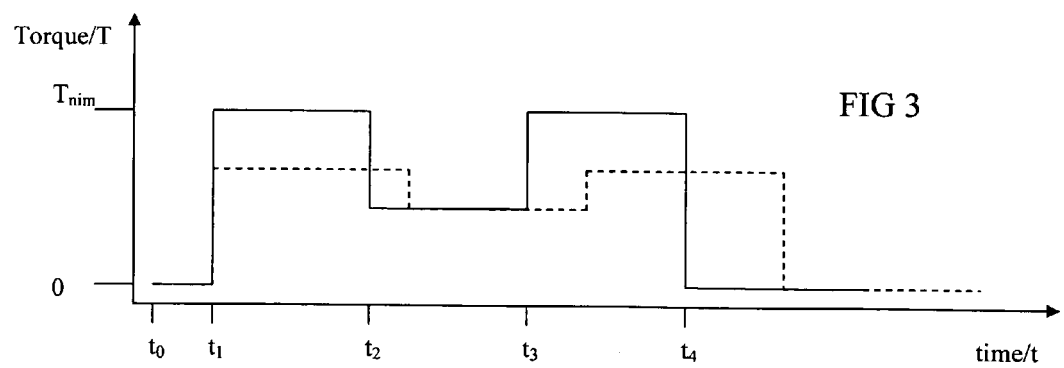
Figure 4:
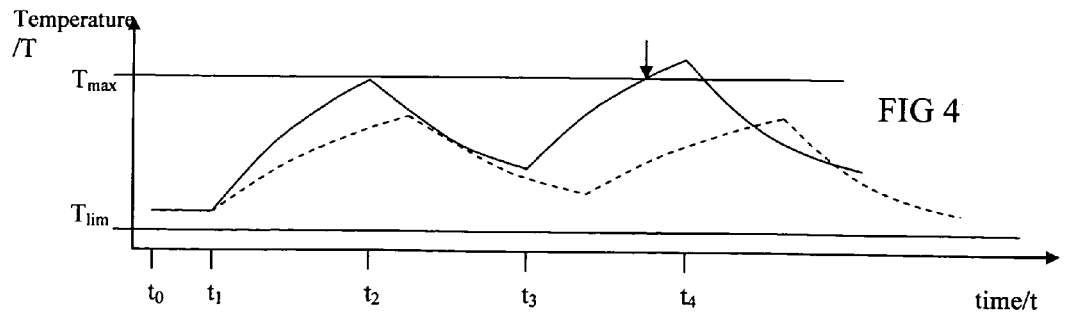

FIGS. 3 and 4 show the slowing of the process. In FIG. 3 the unbroken line shows the torque curve shown in FIG. 1 and the broken line shows the torque curve associated with the slowed process. Correspondingly in FIG. 4 the unbroken line shows the temperature curve shown in FIG. 2 and the broken line shows the temperature curve associated with the slowed process.

FIG. 4 is also provided with horizontal lines describing the temperature limit $T_{lim}$ and the maximum temperature $T_{max}$. The difference between the two temperatures (plus a possible margin) refers to the heating defined above. As shown in FIG. 4 the temperature of the semiconductor component is at the start of the torque step above the temperature limit, i.e. the maximum allowed starting temperature of the component. Thus, the loading period implemented with a normal torque reference could cause the temperature of the power component to exceed the maximum temperature. This point is indicated in the figure with an arrow.

The heating of an average cycle can also be utilized for determining the operating life of the frequency converter. The component manufacturers provide the power semiconductor with an average estimation about how many cyclic loads the component will endure at a particular average heating. When the heating is known, then the operating life of the apparatus can be estimated in the frequency converter based on the temporary density of the loading cycles. This piece of information is advantageous for the operating staff of the apparatus and based on said information the staff is able to estimate when the apparatus is to be renewed before the apparatus may be subjected to malfunction while in use. The estimated operating life can be shown directly in years and months to the operating staff in the operation panel of the frequency converter or possibly on the display unit of the upper control system communicating with the frequency converter.

What also affects the loading capacity of the frequency converter is the condition of the cooling system. The cooling system typically comprises a cooling element, which is thermally connected to the power semiconductor, and a fan that intensifies the operation of the cooling element by transferring heat from the element to the surrounding air. When the cooling system is subjected to malfunction the cooling does not operate as desired and the temperature increases more than has been intended. A possible malfunction may be caused by a broken fan or by unclean cooling fins in the cooling plate.

The condition of the cooling system can be monitored by determining the temperature of the cooling element, such as the cooling plate, when the apparatus remains stationary or after a load change. The measured temperature of the cooling plate can for instance be compared to the temperature according to a model prepared of the cooling plate and thermal components associated therewith. If the temperature according to the model decreases faster than the actual measured temperature, then it may be assumed that the cooling system is subjected to malfunction. The malfunction can also be observed in such a manner that a temperature time constant is determined for the cooling plate when commissioning the apparatus. If the temperature measured during use does not behave in accordance with the temperature time constant, then the cooling system is subjected to failure. Concerning such a failure the frequency converter may generate an alarm to the operating staff, or alternatively prevent the apparatus from being loading. The condition of the cooling apparatus is significant as regards the anticipated protection according to the invention, since the magnitude of the average heating changes and the temperature is restored slowly below the temperature limit when the cooling is inadequate.

Figure 5:
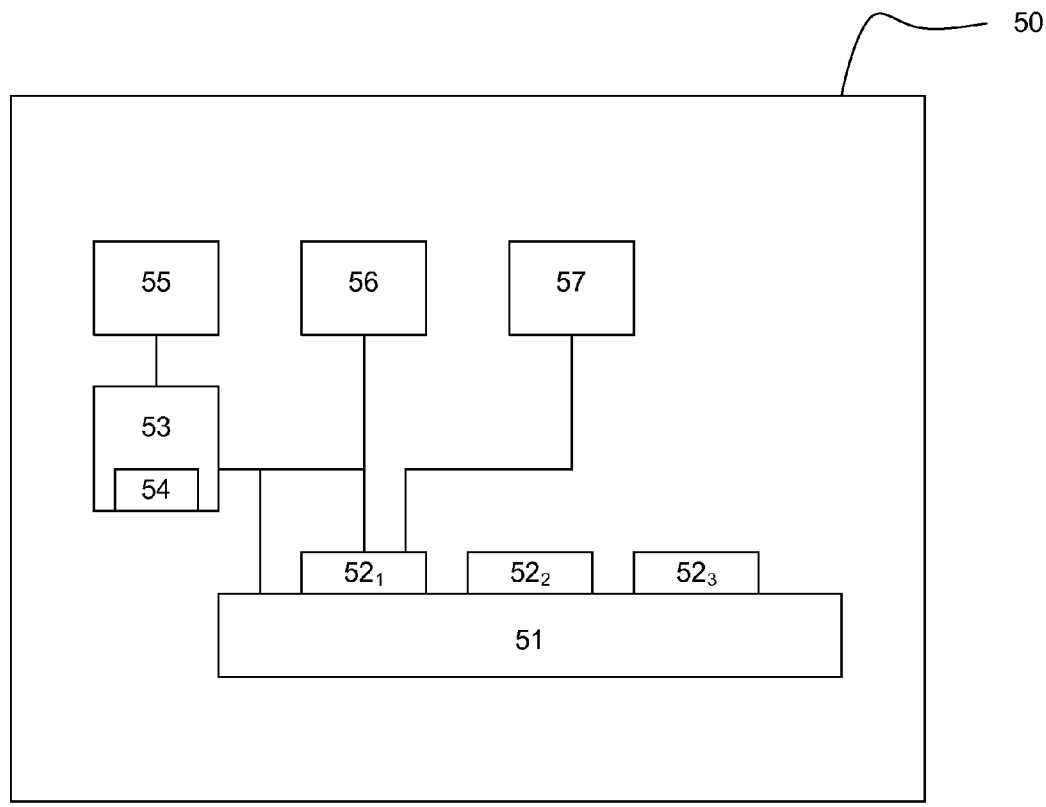
FIG. 5 illustrates features of a frequency converter.

FIG. 5 illustrates an exemplary frequency converter 50 including several semiconductors $52_1$ to $52_3$ (each one of which may be a power semiconductor). The frequency converter 50 is arranged for periodic recurrent use. The frequency converter 50 includes a cooling system 51 having a cooling plate, and means 53 for determining and storing, in a memory 54, a magnitude of an average temperature rise of a power semiconductor 52 in the frequency converter 50, caused by one loading period. The frequency converter 50 also includes means 55 for determining a temperature limit from the determined temperature rise and a highest allowed temperature of the power semiconductor, and means 56 for determining the temperature of the power semiconductor 52 in the frequency converter 50. In addition, the frequency converter 50 includes means 57 for changing the operation mode of the frequency converter by reducing the torque limit on-line when the temperature of the power semiconductor exceeds the temperature limit when transferring to a loading period. The means 53 for determining of the magnitude of the average temperature rise caused by one loading period include means for determining the magnitude of the temperature before the start of the loading period, means for determining the magnitude of the temperature after the loading period, and means for calculating the difference of the determined temperatures.

It is apparent for those skilled in the art that as technology advanced the basic idea of the invention can be implemented in various ways. The invention and the preferred embodiments thereof are therefore not limited to the examples above but may vary within the scope of the claims.

The invention claimed is:

1. A method in connection with a frequency converter, the frequency converter being arranged for periodic recurrent use, wherein the method comprises steps of:
   determining and storing in a memory a magnitude of an average temperature rise of a power semiconductor in the frequency converter, caused by one loading period;
   determining a temperature limit from the determined temperature rise and a highest allowed temperature of the power semiconductor;
   determining the temperature of the power semiconductor in the frequency converter; and
   changing the operation mode of the frequency converter by reducing a torque limit on-line when the temperature of the power semiconductor exceeds the temperature limit when transferring to a loading period,
   wherein the determining of the magnitude of the average temperature rise caused by one loading period comprises:
      (i) determining the magnitude of the temperature before the start of the loading period;
      (ii) determining the magnitude of the temperature after the loading period;
      (iii) calculating the difference of the determined temperatures; and
      (iv) repeating steps (i)-(iii) and calculating the mean of the differences of the determined temperatures.

2. A method as claimed in claim 1, wherein the mean of the differences between the starting temperatures and the end temperatures is calculated as an arithmetic mean.

3. A method as claimed in claim 1, wherein the mean of the differences between the starting temperatures and the end temperatures is calculated as a root-mean-square value.

4. A method as claimed in claim 1, wherein the determining of the temperature limit from the determined temperature rise and from the highest allowed temperature of the power semiconductor comprises subtracting the determined temperature rise from the highest allowed temperature of the power semiconductor in order to provide the temperature limit.

5. A method as claimed in claim 1, wherein the determining of the temperature limit from the determined temperature rise and from the highest allowed temperature of the power semiconductor comprises subtracting from the highest allowed temperature of the power semiconductor the sum of the determined temperature rise and a safety margin in order to provide the temperature limit.

6. A method as claimed in claim 1, wherein the determining of the temperature of the power semiconductor in the frequency converter comprises measuring the temperature of a cooling plate of the power semiconductor and calculating the temperature of the power semiconductor from the temperature of the cooling plate.

7. A method as claimed in claim 1, wherein the changing of the operation mode of the frequency converter comprises preventing the use of the frequency converter.

8. A method as claimed in claim 1, comprising:
   observing the working condition of a cooling system of the power semiconductor in the frequency converter by comparing the temperature change of a cooling plate of the power semiconductor to the previously implemented temperature changes or to the temperature change to be calculated from a temperature model.

9. A method as claimed in claim 8, comprising:
   providing an alarm signal in response to the weakening of a working condition of a cooling system of the power semiconductor in the frequency converter.

10. A frequency converter comprising several semiconductors and being arranged for periodic recurrent use, wherein the frequency converter comprises:
    means for determining and storing a magnitude of an average temperature rise of a power semiconductor in the frequency converter, caused by one loading period,
    means for determining a temperature limit from the determined temperature rise and a highest allowed temperature of the power semiconductor,
    means for determining the temperature of the power semiconductor in the frequency converter, and
    means for changing the operation mode of the frequency converter by reducing the torque limit on-line when the temperature of the power semiconductor exceeds the temperature limit when transferring to a loading period,
    wherein the means for determining of the magnitude of the average temperature rise caused by one loading period comprises:
       means for determining the magnitude of the temperature before the start of the loading period;
       means for determining the magnitude of the temperature after the loading period; and
       means for calculating the difference of the determined temperatures.

* * * * *